United States Patent [19]

Meusburger et al.

[11] 4,242,603
[45] Dec. 30, 1980

[54] DYNAMIC STORAGE ELEMENT

[75] Inventors: Guenther Meusburger, Munich; Karl Knauer, Starnberg; Jenoe Tihanyi, Munich, all of Fed. Rep. of Germany

[73] Assignee: Siemens Aktiengesellschaft, Berlin & Munich, Fed. Rep. of Germany

[21] Appl. No.: 907,013

[22] Filed: May 18, 1978

[30] Foreign Application Priority Data

Jun. 8, 1977 [DE] Fed. Rep. of Germany ....... 2726014

[51] Int. Cl.³ .......................................... H01L 27/04
[52] U.S. Cl. .................................. 307/238; 307/304; 365/182; 357/22; 357/23; 357/24
[58] Field of Search ...................... 357/22, 23, 24, 41, 357/45; 307/238; 365/182, 186

[56]  References Cited
U.S. PATENT DOCUMENTS

| 3,865,651 | 2/1975  | Arita          | 357/45 |
| 3,914,855 | 10/1975 | Cheney et al.  | 357/45 |
| 3,986,180 | 10/1976 | Cade           | 357/41 |
| 4,003,036 | 1/1977  | Jenne          | 357/41 |
| 4,126,899 | 11/1978 | Lohstroh et al.| 357/41 |
| 4,126,900 | 11/1978 | Koomen et al.  | 357/22 |

OTHER PUBLICATIONS

Stein et al., IEEE J. of Solid State Circuits, vol. Sc-8, No. 5, Oct. 1973, pp. 319-323.
Lewis et al., IBM Tech. Discl. Bulletin, vol. 15, No. 9, Feb. 1973, p. 2822.

Primary Examiner—William D. Larkins
Attorney, Agent, or Firm—Hill, Van Santen, Steadman, Chiara & Simpson

[57]  ABSTRACT

A dynamic storage element has an electrically insulating layer carried on a substrate of semiconductor material. A conductor path, provided with a terminal, is arranged on the electrically insulating layer, and first and second zones, doped oppositely to the substrate, are provided on the surface of the substrate. The zones are spaced from one another. In that region of the substrate between the zones the substrate is more highly doped with dopants of the same type as those contained in the substrate and the conductor path extends above the highly doped region.

2 Claims, 8 Drawing Figures

DYNAMIC STORAGE ELEMENT

BACKGROUND OF THE INVENTION

1. Field of the Invention

The present invention relates to a dynamic storage element of the type in which an electrically insulating layer is applied to a substrate of semiconductor material and a conductor path is provided with a terminal on the electrically insulating layer, and in which first and second zones, doped oppositely to the substrate are provided on the surface of the substrate spaced from each other.

2. Description of the Prior Art

Dynamic storage elements are well known in the art and take various constructions. For example, the publication of K. U. Stein, H. Friedrich, "A 1-Mil$^2$ Single-Transistor Memory Cell in n-Silicon-Gate Technology", IEEE Journal of Solid-State Circuits, Vol. SC-8, No. 5, October 1973, pages 319–323, describes single-transistor storage elements.

SUMMARY OF THE INVENTION

The object of the present invention is to provide a dynamic storage element having minimal dimensions.

This object is achieved through the provision of a storage element of the type described above which is characterized in that the doped zones in a substrate, with the doping opposite to that of the substrate, have a region therebetween which is highly doped with dopants of the same type as those contained in the doped substrate and a conductor path extends above this highly doped region.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
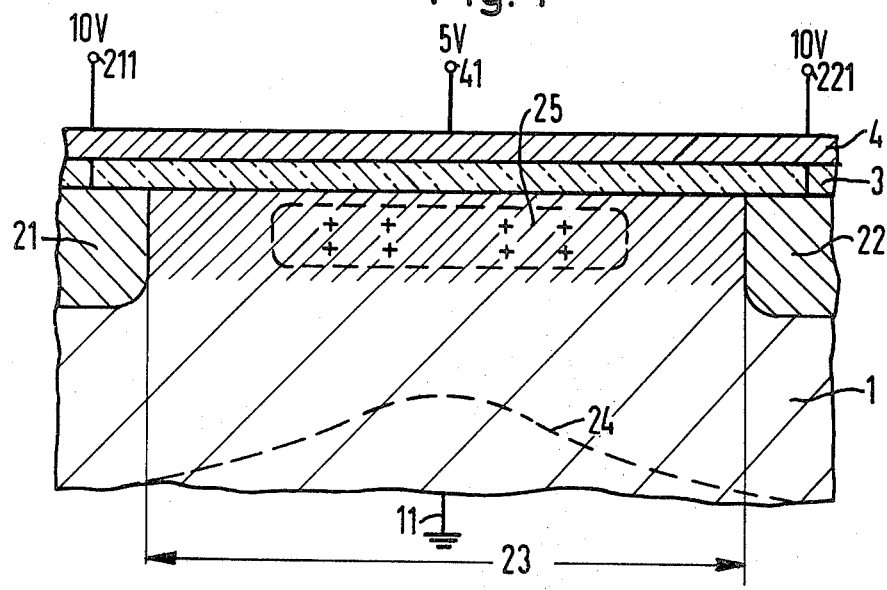
FIG. 1 schematically illustrates, in a cross-sectional view, a storage element constructed in accordance with the present invention.

Referring to FIG. 1, a semiconductor substrate 1 comprises, for example, p-doped silicon material. The substrate 1 is provided with a terminal 11 which is preferably connected to ground potential. In the manner illustrated on the drawing, two zones 21 and 22, doped oppositely to the substrate 1, are arranged in the substrate 1 at the surface thereof. The zones 21 and 22 are preferably n$^+$-doped. The zones 21 and 22 are separated from one another by a distance 23. The zone governed by the distance 23 between the n$^+$-doped zones 21 and 22 is preferably p$^+$-doped on the semiconductor surface of the substrate 1. An electrically insulating layer 3, which may preferably comprise SiO$_2$, is applied to the semiconductor surface and to the diffused zones 21 and 22. A conductor path 4, which preferably consists of aluminum, is applied to the electrically insulating layer 3. The conductor path 4 is provided with an electrical terminal 41. The zone 21 is provided with a terminal 211 and the zone 22 is provided with a terminal 221. Whereas the zones 21 and 22 extend in the form of channels at right angles to the plane of the drawing, the conductor path 4 runs at right angles to the zones 21 and 22.

The following considerations led to the present invention. If the two n$^+$-diffused zones 21 and 22, relative to the substrate, are connected with an appropriately high potential, a depletion zone 24 is formed which overlaps, only in the substrate 1, not however in the highly doped layer between the zones 21 and 22. By means of an appropriate voltage applied to the terminal 41 of the conductor path 4, a depletion edge layer can also be produced on the semiconductor surface in the region of the highly doped layer between the n$^+$-doped zones 21 and 22, producing a closed, neutral zone 25. Here, the potential of the n$^+$-doped zones 21 and 22 is always to be greater than the potential of the conductor path 4 so that no inversion layer exists. For example, the potential at the terminals 211 and 221 of the n$^+$-doped zones amounts to 10 V and at the terminal 41 of the conductor path 4 amounts to 5 V. During operation it is necessary for the neutral zone 25 beneath the conductor path 4 to be laterally separated from the semiconductor substrate by suitable measures, for example by electrodes or by appropriately doped zones. The size, potential and charge quantity of the neutral zone 25 can be influenced by the various measures described below.

Measure 1

Figure 2:
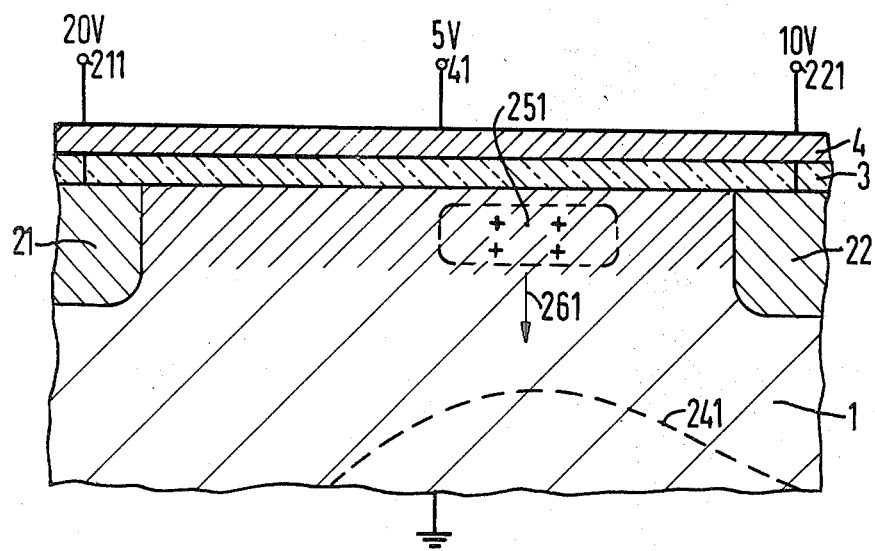
FIGS. 2–4 illustrate possible techniques for influencing a neutral zone of a storage element constructed in accordance with the invention.

In the event of an increase in the potential of one of the n$^+$-diffused zones 21 and 22, as illustrated by the potential 20 V on the terminal 211 in FIG. 2, the neutral zone 25 is reduced in size. Excess charge flows out of the neutral zone 25 into the semiconductor substrate, as indicated by the arrow 261. In the arrangement illustrated in FIG. 2, the potential across the electrode 211 of the n$^+$-doped zone 21 amounts, for example, to 20 V, as set forth above, and that applied to the electrode 221 of the n$^+$-doped zone 22 amounts to 10 V, and that across the electrode 41 of the conductor path 4 amounts to 5 V. As a result of the increase in the potential across the electrode 211 from 10 V to 20 V, the positive charge carriers of the neutral zone 25 (FIG. 1) between the n$^+$-doped zones 21 and 22 are moved away from the zone 21 and emitted partially into the substrate 1. The potential course 241 and the neutral zone 251 occur.

Measure 2

Figure 3:
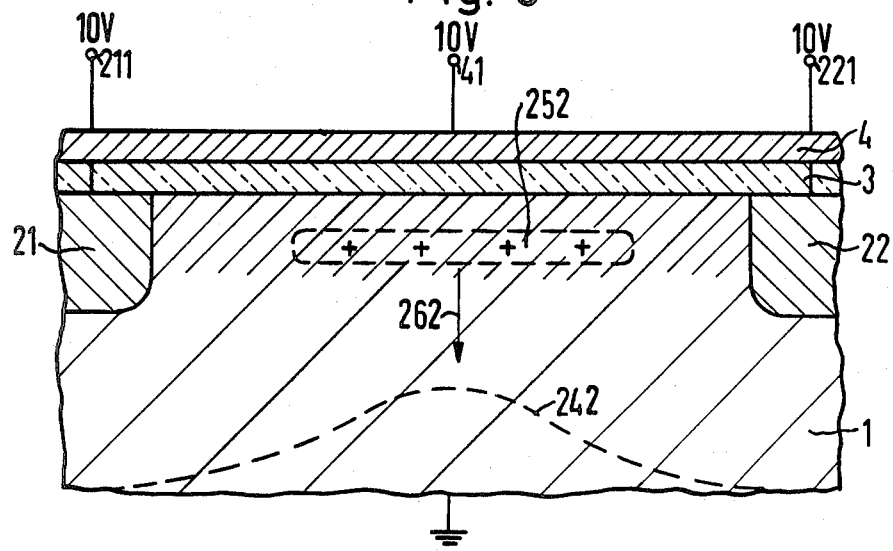

As can be seen from FIG. 3, the neutral zone 25 (FIG. 1) is likewise reduced in the event of an increase in the gate voltage. Excess charge flows into the substrate, as indicated by the arrow 262. For example, a potential of 10 V is connected to each of the n$^+$-doped zones 21 and 22; however, in comparison to the arrangement illustrated in FIG. 2, the potential across the terminal 41 of the line 4 has been increased to 10 V. In this case, the neutral zone 252 and the potential course 242 occur.

Measure 3

Figure 4:
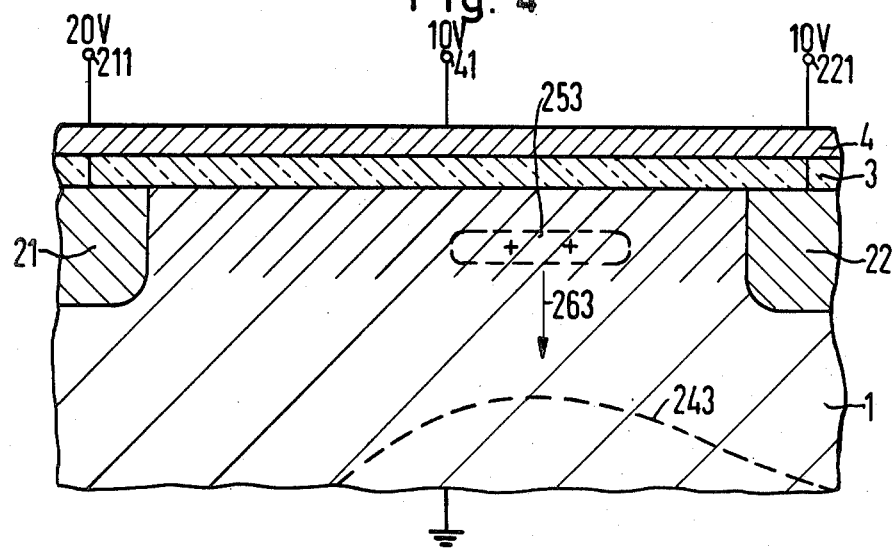

As can be seen from FIG. 4, a combination of the Measure 1 and the Measure 2 results in a further reduction in the neutral zone 25 (FIG. 1). In the arrangement illustrated in FIG. 4, the zone 21 carries, for example, a potential of 20 V at the terminal 211, the zone 22 carries a potential of 10 V as applied to the terminal 221, and the electrode 41 carries a potential of 10 V. In this case, the neutral zone 253 and the potential curve 243 occur. As indicated by arrow 263, the charge carriers are emitted to the substrate.

Measure 4

Figure 5:
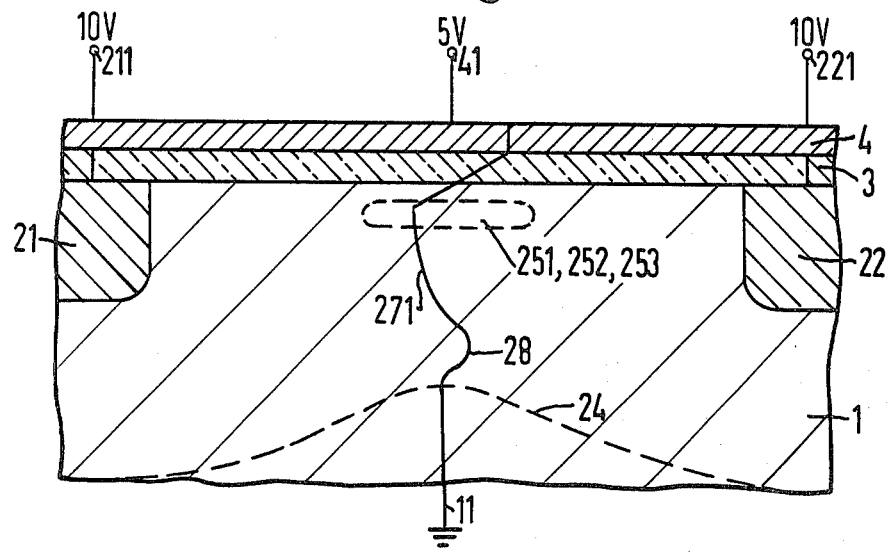
FIGS. 5 and 6 illustrate the charge flow from the substrate into the neutral zone of the storage element.
Figure 6:
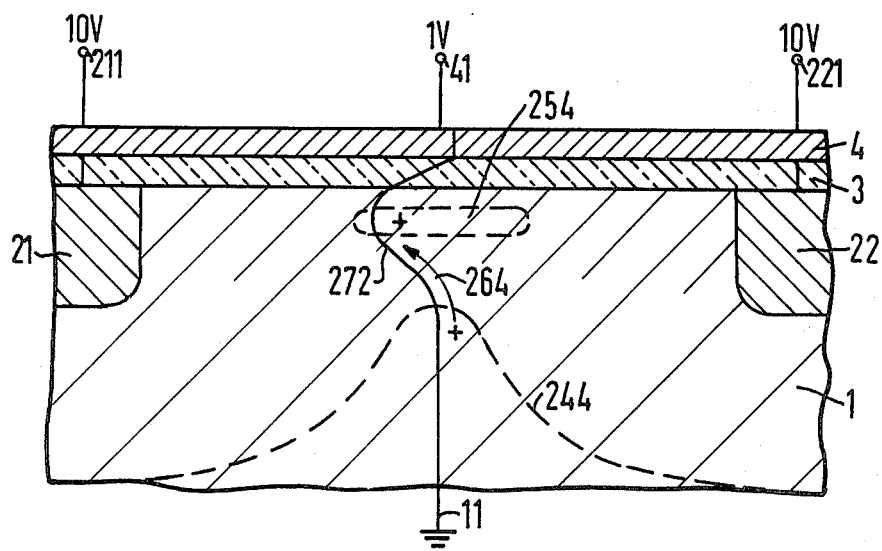

If the charge is eliminated from the neutral zone 25 (FIG. 1), and if subsequently the corresponding measure which led to the elimination of the charge is cancelled, a sink is formed in the neutral zone 251 to 253. This is illustrated in FIG. 5, which represents a potential course 271. When a storage element is in operation it is necessary that the construction of the element should be selected to be such that following the application of an individual of the above-described measures, a potential threshold to the neutral substrate zone still exists. This threshold is illustrated in FIG. 5 and referenced 28. However, the threshold 28 is to be able to be broken down by a reduction in the voltage carried by the conductor path 4 so that charge can flow out of the substrate into the sink. For example, as is illustrated in FIG. 6, the potential carried by the conductor path 4 is reduced to 1 V. This causes the potential course 244 to form and causes positive charges to flow out of the substrate into the neutral 254, as indicated by the arrow 264.

Measure 5

Figure 7:
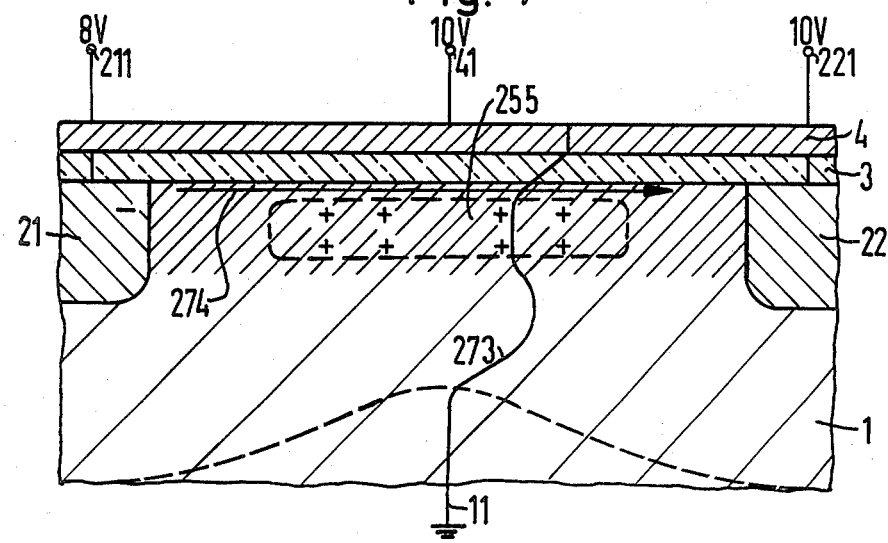
FIGS. 7 and 8 illustrate the current flow between the two n$^+$-doped zones of the storage element.
Figure 8:
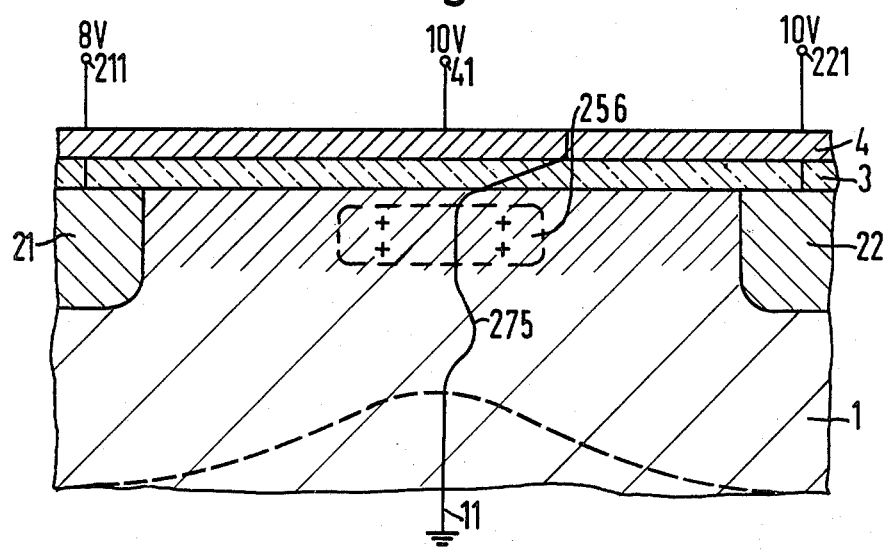

If subsequently the surface potential of the metal-oxide-semiconductor (MOS) capacitor is raised so that it exceeds that of one of the n+-doped zones 21, 22 a current can flow between these two zones. In this case, the surface potential 273, 274, in addition to the electrode voltage, is also dependent upon the charge in the neutral zone. During operation in accordance with FIG. 7, a large quantity of charge is present in the neutral zone 255. The potential course 273 results. A current flow is possible between the two n+-doped zones 21 and 22, as indicated by the arrow 274. During operation in accordance with FIG. 8, little charge is present in the neutral zone 256 and the potential course 275 occurs. No current can flow between the zones 21 and 22 in this condition.

The construction of a matrix comprising storage elements in accordance with the invention will be described below.

The matrix comprises channel-like n+-dopings 21 and 22 arranged in the p-doped substrate 1. The dopings 22, which in the following will be referred to as ground lines, are always to carry a fixed potential, preferably ground potential. The n+-dopings 21 represent the bit lines of the matrix. The conductor paths 4 represent the word lines.

The ground lines separate the individual elements from one another in the x-direction. In the y-direction, the separation of the p+-doped zones between the n+-doped zones is only carried out by the p-doped substrate zones above which there is no conductor path 4.

With design rule of 5 μm, an element has an area requirement of 200 μm².

The mode of operation of the above-described matrix is described below. As a starting condition, the ground lines carry, for example, a constant 10 V, i.e. an electronic ground of 10 V, the bit lines carry 8 V and the word lines carry 5 V. The substrate bias voltage amounts to 0 V.

For writing information, it is first of all insured in a row that a sufficient quantity of charge is present in each element. This is carried out in that the potential of the word line 4 is reduced to 0 V, as described in Measure 4 and as illustrated in FIG. 6. In order now to be able to write a "1" or a "0" bit of information into this row, the voltage carried by the bit line 21 in which is arranged the element into which a "0" is to be written, is raised from 8 V to 18 V. This corresponds to Measure 1. Consequently, the neutral zone is reduced in all the elements which are connected to this bit line. Here, it should be noted that no current can flow in the p-zones between the storage elements. Now, the voltage is raised from 0 V to 10 V on the corresponding word line 4, which corresponds to Measure 2. The neutral zone of all of the elements in the row are consequently reduced. The neutral zone of those elements whose bit line is connected to 18 V is doubly influenced. Now, writing is carried out in all the rows, and the neutral zones of those elements into which a "0" is to be written are influenced simultaneously by the bit line 21 and the word line 4, whereas the others are influenced only by the word line 4. In accordance with the different influences, the elements containing the information bit "1" and the elements containing the information bit "0" possess different quantities of charge. This information can now be read in accordance with Measure 5. By raising the voltage on a word line 4 which is connected to the element which is to be read, the surface potential of the elements of the row is set to be such that it remains below that of the elements containing the information bit "1", but above that of the elements containing the information bit "0". Consequently, in the case of the elements containing the information bit "0" a current can flow between the bit line 21 and the ground line 22. Because of the symmetrical construction of the elements, the current can flow in both directions from the bit line as a result of which the current strength increases. This current is then evaluated as a "0" information, whereas no current flows in the case of a "1" bit of information.

Although we have described our invention by reference to a particular illustrative embodiment thereof, many changes and modifications of the invention may become apparent to those skilled in the art without departing from the spirit and scope of the invention. We therefore intend to include within the patent warranged hereon all such changes and modifications as may reasonably and properly be included within the scope of our contribution to the art.

We claim:

1. A process for operating a storage element which comprises a semiconductor substrate doped with a dopant of a first conductivity type, a substrate terminal connected to a reference potential, an insulating layer carried on said substrate, first and second doped zones with a substrate region therebetween at the surface of the substrate, the zones doped opposite to the substrate and the region doped with the first conductivity dopant and to a greater degree than the substrate, the first zone constituting a bit line, the second zone constituting a reference line, and a metal word line carried on the insulating layer over the highly doped region, comprising the steps of:

applying a constant first potential to the reference line with respect to the reference potential at the substrate terminal;

applying a second potential differing less than the first potential from the reference potential at the substrate terminal to the word line to introduce a charge into the doped region for writing;

altering the potential on the bit line and the word line in such a manner as to increase the potential differences with respect to the reference potential of the substrate terminal; and altering the potential on the bit line to increase the potential difference with respect to the reference potential at the substrate terminal, while maintaining the potential constant on the word line to write a "1".

2. The process of claim 1, comprising the further step of:

altering the potential on the word line, so as to increase its potential difference with respect to the reference potential at the substrate terminal, in order to read a "1" or a "0" such that the surface potential is below that corresponding to a "1" and above that corresponding to a "0".

* * * * *